(12) United States Patent
Lee et al.

(10) Patent No.: US 9,773,554 B2
(45) Date of Patent: Sep. 26, 2017

(54) COMPOSITE IMPURITY SCHEME FOR MEMORY TECHNOLOGIES

(71) Applicant: Macronix International Co., Ltd., Hsinchu (TW)

(72) Inventors: Chih-Wei Lee, New Taipei (TW); Tien-Fan Ou, New Taipei (TW); Jyun-Siang Huang, Chiayi (TW); Chien-Hung Liu, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 546 days.

(21) Appl. No.: 14/242,757

(22) Filed: Apr. 1, 2014

(65) Prior Publication Data

US 2015/0279468 A1    Oct. 1, 2015

(51) Int. Cl.
| | |
|---|---|
| H01L 27/11 | (2006.01) |
| H01L 27/112 | (2006.01) |
| G11C 16/04 | (2006.01) |
| H01L 27/11568 | (2017.01) |
| H01L 21/265 | (2006.01) |
| H01L 29/10 | (2006.01) |
| H01L 29/167 | (2006.01) |

(52) U.S. Cl.
CPC .... *G11C 16/0491* (2013.01); *H01L 21/26513* (2013.01); *H01L 27/11568* (2013.01); *H01L 29/1045* (2013.01); *H01L 21/2658* (2013.01); *H01L 21/26586* (2013.01); *H01L 29/167* (2013.01)

(58) Field of Classification Search
CPC . H01L 21/8239; H01L 45/04; H01L 27/11585
See application file for complete search history.

(56) References Cited

U.S. PATENT DOCUMENTS

| | | | |
|---|---|---|---|
| 2005/0098813 A1 | 5/2005 | Sekiguchi et al. | |
| 2007/0298557 A1* | 12/2007 | Nieh | H01L 21/26586 438/197 |
| 2009/0045452 A1* | 2/2009 | Lue | G11C 16/0466 257/321 |
| 2011/0233610 A1 | 9/2011 | Cho et al. | |

OTHER PUBLICATIONS

Cagnat, et al., "Ultrathin n+/p junction in preamorphized silicon by phosphorus and carbon coimplantation engineering: Influence of C location," Journal of Applied Physics , vol. 102, No. 10, pp. 106102,106102-106103, Nov. 2007.

(Continued)

*Primary Examiner* — Mohammad Choudhry
(74) *Attorney, Agent, or Firm* — Haynes Beffel & Wolfeld LLP

(57) ABSTRACT

An integrated circuit comprises a memory array including diffusion bit lines having composite impurity profiles in a substrate. A plurality of word lines overlies channel regions in the substrate between the diffusion bit lines, with data storage structures such as floating gate structures or dielectric charge trapping structures, at the cross-points. The composite impurity diffusion bit lines provide source/drain terminals on opposing sides of the channel regions that have high conductivity, good depth and steep doping profiles, even with channel region critical dimensions below 50 nanometers.

19 Claims, 17 Drawing Sheets

(56) References Cited

OTHER PUBLICATIONS

Das et al., "Effects of Halo Implant on Hot Carrier Reliability of Sub-quarter micron MOSFETs" IEEE 36th Annual Int'l Reliability Physics Symposium, Mar. 31-Apr. 2, 1998, 5 pages.
Ku, et al., "Effects of germanium and carbon coimplants on phosphorus diffusion in silicon," Applied Physics Letters vol. 89, No. 11, pp. 112104,112104-112103, Sep. 2006.
Yako, et al., "Cold (-100° C.) Carbon co-Implantation into High Phosphorus Doping Source/Drain Extensions for Aggressively Scaled NFETs," IEEE 11th Int'l Workshop on Junction Technology, Jun. 9-10, 2011, 3 pages.

* cited by examiner

COMPOSITE IMPURITY SCHEME FOR MEMORY TECHNOLOGIES

BACKGROUND OF THE INVENTION

Field of the Invention

The present invention relates to integrated circuit memory technology, including high density, nonvolatile memory.

Description of Related Art

One type of array architecture for nonvolatile memory is known as a virtual ground array. In virtual ground arrays, and other memory cell structures, buried diffusion lines can be disposed on a substrate, separated by channel regions. Word lines and data storage structures, such as floating gates or dielectric charge trapping structures, overlie the channel regions, forming a dense array of memory cells.

As the scale of the memory cells is reduced, challenges are created in the design of virtual ground arrays, and other types of memory cells. For example, it is desirable that the buried diffusion lines have low resistance, provide good punch through immunity for the memory cells, and support good programming efficiency and low data disturbance. Also, it is desirable to provide deep impurities in the buried diffusion lines, to block secondary electrons generated in neighboring cells from affecting the local channel region.

However, as the buried diffusion lines become narrower, the resistance of the lines becomes higher. Higher resistance in the buried diffusion lines can slow down operating speeds, including programming speeds for flash memory. With channel lengths and source/drain line widths about 50 nanometers, and below, memory performance has degraded.

Accordingly, it would be desirable to provide a technology enabling formation of dense memory arrays, including dense virtual ground flash memory arrays, that provides for high speed operation, and good endurance.

SUMMARY OF THE INVENTION

One aspect of the technology is an integrated circuit comprising a memory array including diffusion bit lines having composite impurity profiles. A plurality of word lines overlies channel regions in the substrate, with data storage structures such as floating gate structures or dielectric charge trapping structures, at the cross points. The composite impurity diffusion bit lines provide source/drain terminals on opposing sides of the channel regions that have high conductivity, good depth and steep doping profiles, even with channel region critical dimensions below 50 nanometers. In addition, a memory array utilizing this source/drain terminal structure supports hot carrier programming with good efficiency, reduced neighbor cell disturbance and high speed.

An integrated circuit is described that includes a memory array including a plurality of source/drain lines separated by channel regions in a semiconductor substrate. The source/drain lines have a first impurity which provides charge carriers having a carrier type, making the source/drain lines conductive. A plurality of word lines overlies the channel regions. Data storage structures in the cross points between the word lines and the channel regions define memory cells of the array. A second impurity in interface regions between the channel regions and the source/drain lines suppresses diffusion of the first impurity into the channel regions. The memory array can be a virtual ground array.

The first impurity can be phosphorous, which is characterized by low resistance and high diffusivity in silicon. The second impurity, such as carbon, nitrogen or both, suppresses diffusion of phosphorous. It is believed the diffusion is suppressed by occupying or interacting with interstitial defects in the substrate, that otherwise may support diffusion. Fluorine may be used in some embodiments. Thus, a shallow, high conductivity source/drain line is established that does not encroach on the channel region.

The source/drain lines can include a third impurity providing charge carriers of the same carrier type as the first impurity, such as the higher atomic mass arsenic complementing the lower atomic mass phosphorous. The first impurity can have a distribution profile with a maximum depth, and the third impurity can have a distribution profile with a maximum depth greater than the maximum depth of the first impurity. The third impurity can provide a steep impurity profile of low diffusivity dopant, adding depth to the source/drain line so that it can act as a barrier to charge carriers, such as secondary electrons, that might otherwise move between memory cells in the array.

The integrated circuit can include a fourth impurity in interface regions between the channel regions and the source/drain lines, providing carriers having a carrier type opposite of the carriers provide by the first impurity, acting as a halo implant or punch through reduction impurity. This can further improve junction characteristics for the memory cell.

One embodiment of the technology further includes control circuitry that biases the memory array to perform memory operations, including operations that induce hot carriers at the source/drain to channel junction, on the plurality of memory cells.

A method of manufacturing a memory having the characteristics described above is also described.

Other aspects and advantages of the present invention can be seen on review of the drawings, the detailed description, and the claims which follow.

DETAILED DESCRIPTION

Figure 1:
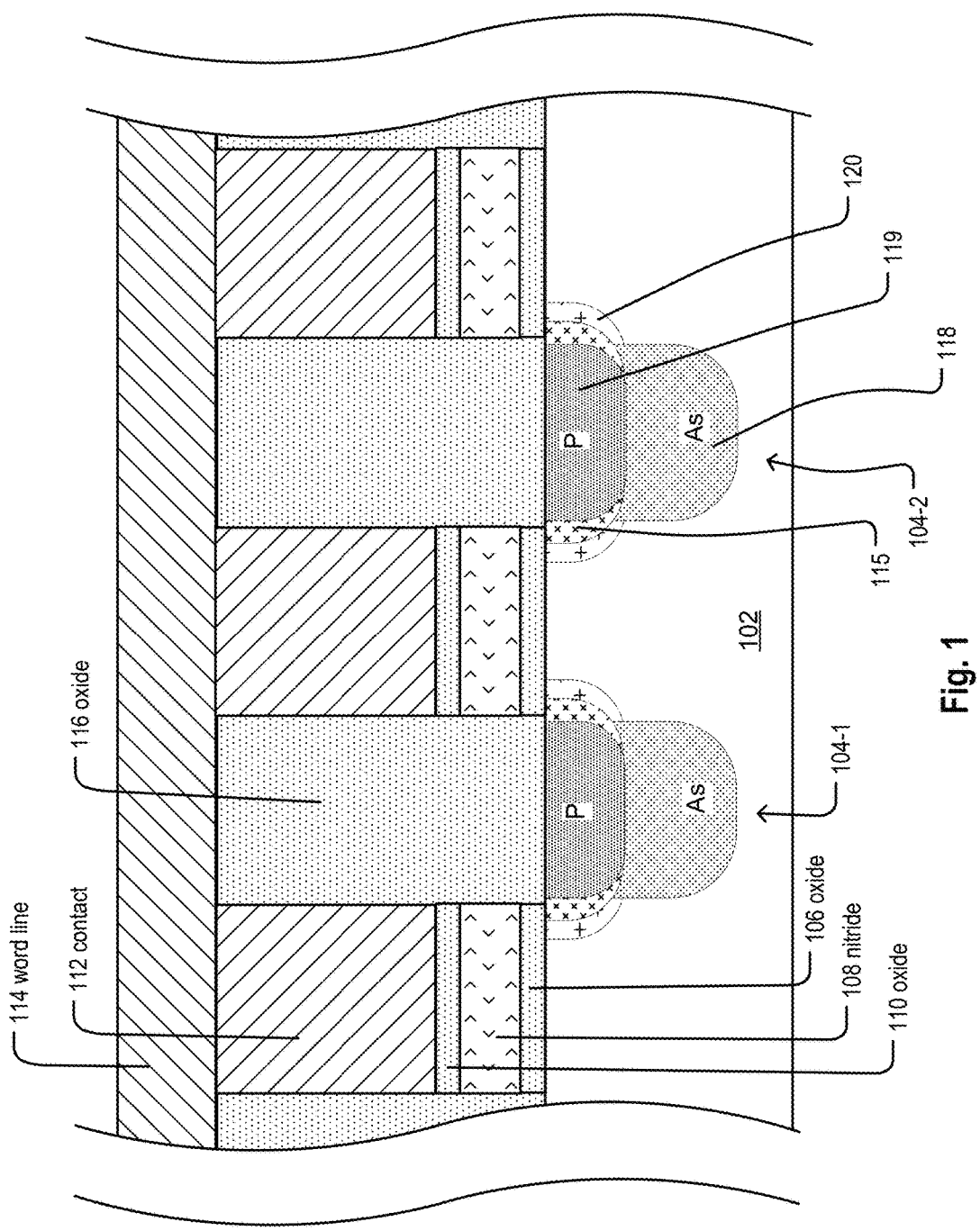
FIG. 1 is a cross-section of a memory array along a word line, showing a buried diffusion bit line having a composite impurity scheme.

FIG. 1 is a cross-section of a memory array along the word line 114, showing buried bit lines 104-1, 104-2 having a confined, high concentration, conductive doping profile that is provided by a composite impurity. The bit lines 104-1, 104-2 in FIG. 1 go into and out of the page, and are formed in the substrate or well 102. Between the buried bit lines 104-1, 104-2, are channel regions in the substrate 102.

Overlying the channel regions are data storage structures, such as the dielectric charge storage structure which comprises oxide 106, nitride 108, and oxide 110. In other embodiments, the data storage structure can comprise a floating gate structure, or other types of dielectric charge storage structures which are operated by inducing movement of charge into and out of the structures. The word line 114 includes contacts (e.g. contact 112), which serve as gates of memory cells in the illustrated embodiment. In some embodiments, the word line 114 can be coplanar with the top surface of the data storage structure. In the illustrated embodiment, the region between the contact (112), and overlying the buried bit lines 104-1, 104-2, is filled with an insulator 116 such as silicon oxide or other oxides.

In a high density array, the buried bit lines 104-1, 104-2 act as source/drain terminals for the memory cells, and the distance between them corresponds with the channel length for the memory cells. It is desirable to reduce the channel length below 50 nanometers, and to shrink the width of the buried bit lines in order to shrink the scale of the memory array.

The term "source/drain terminal" as used herein refers to the current carrying terminals of an FET type cell, which are typically called a source and a drain based on the bias configuration applied to the cell. In the context of the present invention, the terminal which can behave as a source, a drain, or both is referred to as a source/drain terminal, or as part of a source/drain line.

The buried bit lines 104-1, 104-2 have a composite impurity profile. The impurities comprise a dopant, such as phosphorous, in region 119 which is suitable for implementation of low resistance bit lines, but has relatively high diffusivity. Such diffusivity can limit the channel length of the memory cells, and defeat the goal of shrinking the scale of the memory array. The impurities forming the buried bit lines 104-1, 104-2 include a dopant, such as carbon or nitrogen or both, in region 115, which tends to suppress diffusion of the dopant in region 119. The impurities forming the buried bit lines 104-1, 104-2 can also include a deep impurity comprising a dopant such as arsenic in region 118, which while contributing to the reduction in resistance of the bit lines, provides a structure that blocks secondary electrons generated in one memory cell from affecting the channel region of adjacent memory cells in a manner that can disturb charge stored in the cells or cause other problems. Finally, the impurities forming the buried bit lines 104-1, 104-2 can include a halo implant 120 which can have a carrier type opposite that of the dopant in region 119. For example, the halo implant 120 can comprise a combination of boron and indium implanted so as to improve the junction characteristics between the buried bit lines and the channel region.

As a result of the composite impurity, and the doping distributions of the parts of the composite impurity, the scale of the memory array can be reduced. In addition to the ability to reduce the scale of the memory array, as discussed in more detail below, the bit line configuration described herein can improve performance of charge trapping memory cells.

It is believed that the some dopants can interact with interstitial elements in the substrate, and block diffusion pathways through the interstitial defects. Consequently, a co-dopant such as carbon or nitrogen is effective in reducing the diffusivity of phosphorous, and can be used to confine the high conductivity diffusion region which is desirable for memory array structures. The higher diffusivity of phosphorous compared to arsenic can be explained in part by the phenomenon of transient enhanced diffusion (TED) of phosphorous. A co-dopant such as carbon or nitrogen is believed to be effective in reducing TED of phosphorous.

However, it is desirable to provide deep buried bit lines, or deep source/drain terminals, in a charge trapping memory array to provide isolation and resistance to disturbance from neighboring cells. The confined phosphorous impurity therefore is enhanced by a deep arsenic impurity in embodiments described herein, providing a deeper and lower resistance buried bit line in a high density array.

Figure 2:
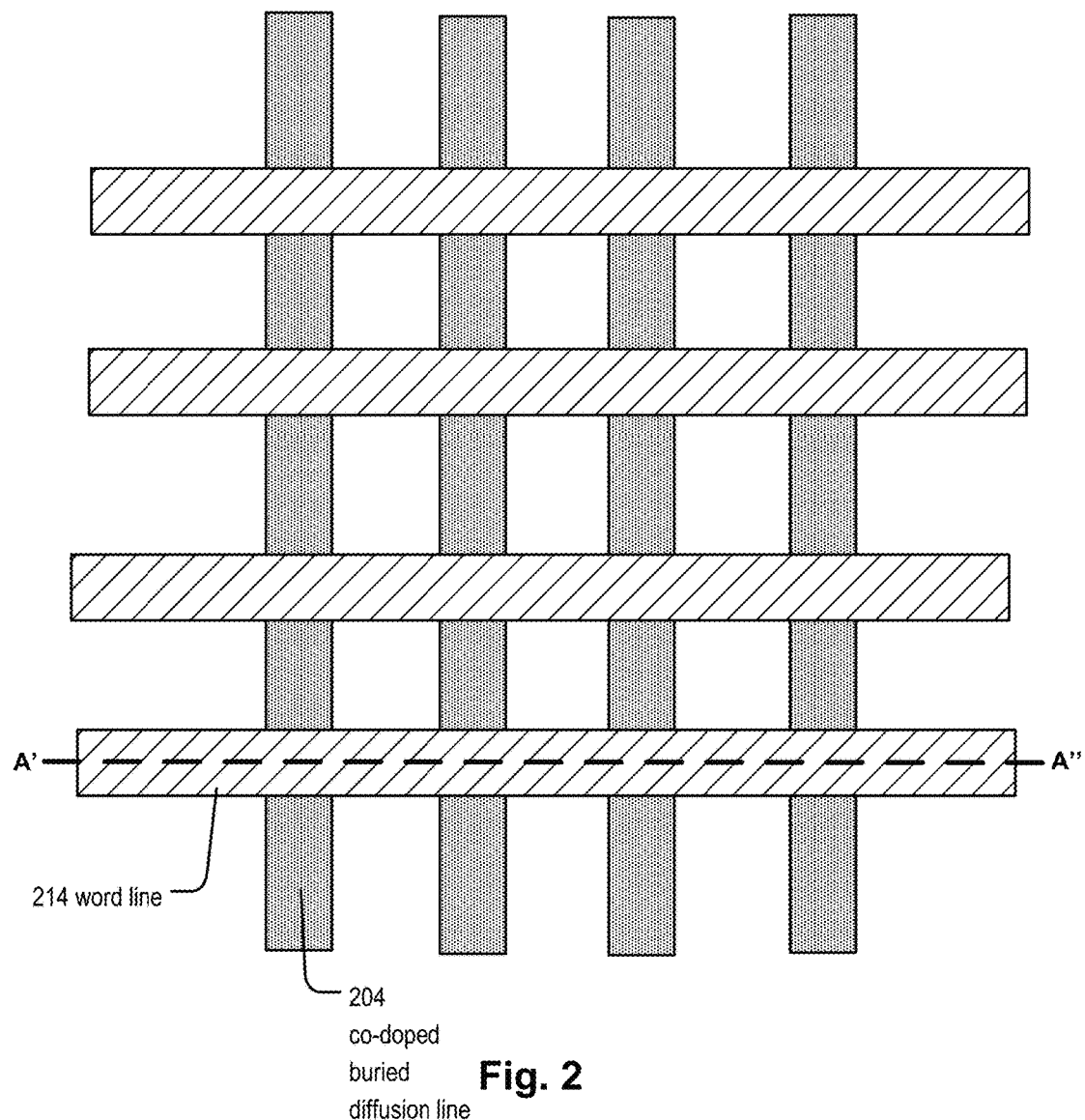
FIG. 2 is a top view of a layout usable in a virtual ground memory array, showing a set of word lines overlying a set of buried bit lines, including a word line with a cross-section line N-A" along which the cross-sections of other figures are taken.

FIG. 2 is a top view of a memory array, showing a set of word lines overlying a set of buried bit lines, including a word line with a cross-section line A'-A" along which the cross-sections of other figures are taken.

FIG. 2 shows a set of bit lines, including composite impurity bit line 204, with a vertical orientation. FIG. 2 also shows a set of word lines, including word line 214, with a horizontal orientation. The set of word lines overlies the set of bit lines. As shown by the cross-section of FIG. 1, memory cells are positioned between adjacent ones of the bit lines and under the word lines.

The memory array can be used for a virtual ground NOR memory architecture. In a virtual ground array, rather than every column of memory cells having its own dedicated pair of bit lines, a bit line is shared by two neighboring columns of memory cells to the right and left. Other array configurations can also utilize source/drain terminals configured as discussed above.

FIGS. 3-10 show stages of a manufacturing process that can be used in making the memory array shown in FIGS. 1 and 2.

Figure 3:
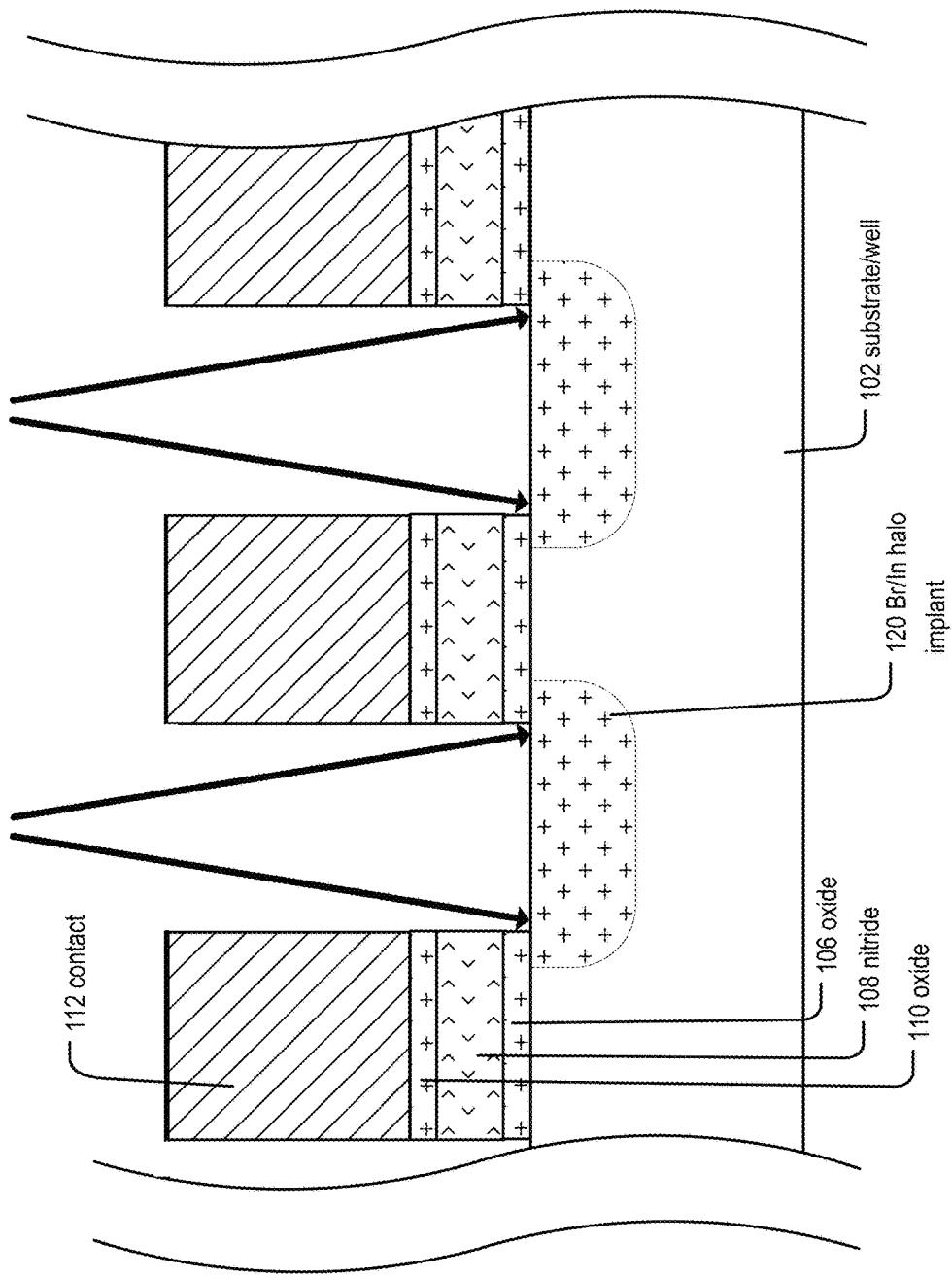
FIG. 3 is a cross-section of a memory array taken along the word line, showing a pocket impurity.

In FIG. 3, a structure is shown after patterning word line contacts over channel regions in a substrate, with data storage structures between the contacts and the channel regions. As illustrated, the word line contacts can be used as a mask for a halo implant 120, or pocket implant, using p-type dopants such as boron and indium as a complement to the n-type buried diffusion bit line, made in the substrate or well 102. The halo implant can be made using an angle implant using In+BrF$_2$ (for example, BF$_2$ with an implant energy of about 50 keV and dose of about $7.5 \times 10^{13}$ cm$^{-2}$; and Indium with an implant energy of about 30 keV and a dose of about $8.0 \times 10^{13}$ cm$^{-2}$), focusing the implant into the interface region between the channel and the buried bit line to be formed. A halo implant can contribute to a steep doping profile in the region. The anti-punch-through dopant has a carrier type that is the opposite to that of the source/drain terminals. As schematically shown in FIG. 1, the halo implant 120 results in a pocket of net increase in p-type doping in the interfaces between the channel and the source/drain terminals.

Figure 4:
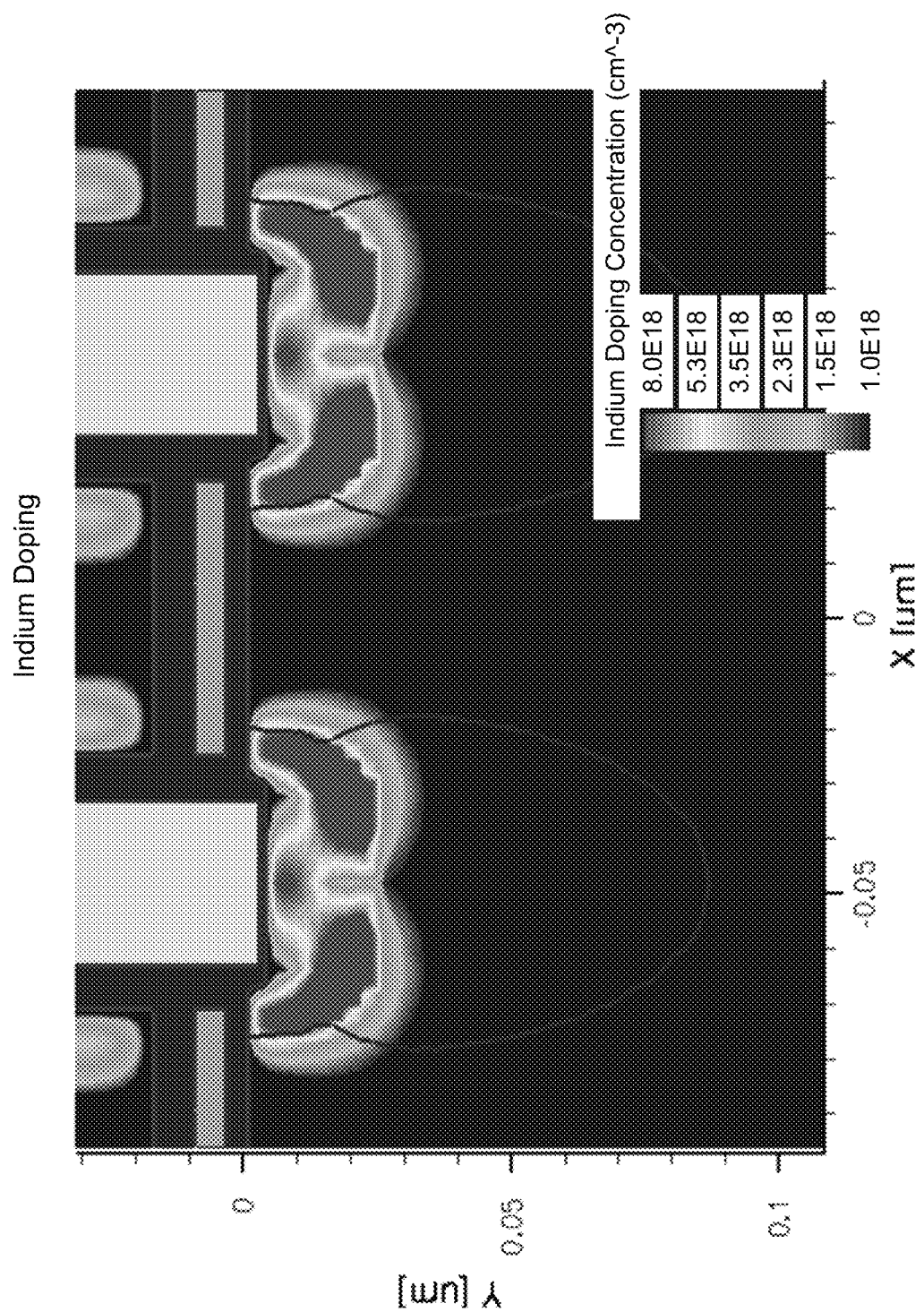
FIG. 4 is a graph showing a simulation of a distribution of p-type indium concentration of a cross-section of a memory array.

FIG. 4 is a graph showing the results of simulation of an example indium doping concentration of a cross-section of a memory array taken along the word line orientation, including the buried bit lines to the right and left and the channel in between the bit lines. The indium doping profile is has a concentration up to about $8 \times 10^{18}$ cm$^\wedge$-3, to a depth of about 25 nanometers from the surface, and extending under the dielectric charge trapping structure by about 10 nanometers.

Figure 5:
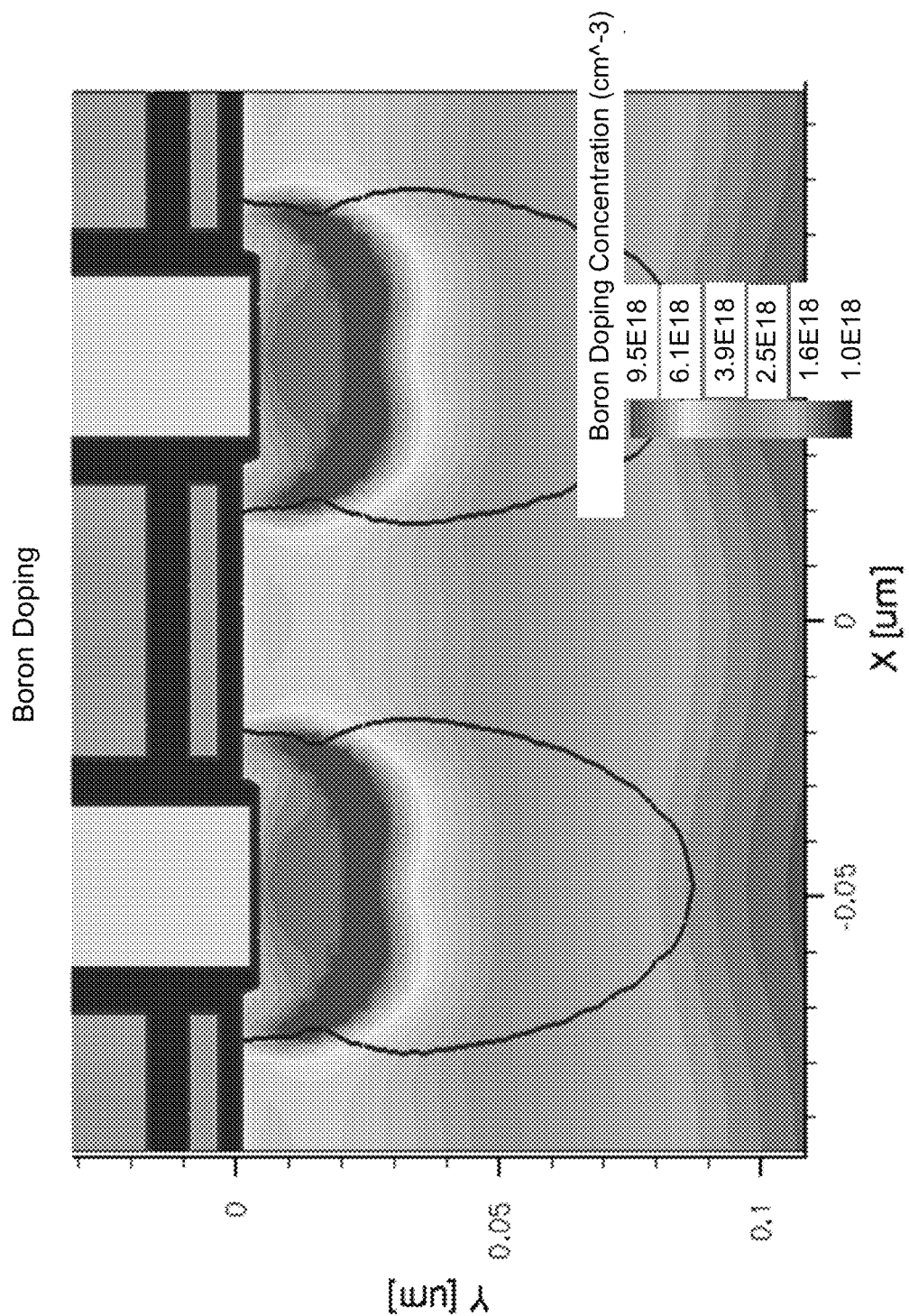
FIG. 5 is a graph showing a simulation of a distribution of p-type boron concentration of a cross-section of a memory array.

FIG. 5 is a graph showing the results of simulation of an example boron doping concentration of a cross-section of a memory array taken along the word line orientation, including the buried bit lines to the right and left and the channel in between the bit lines. The boron doping profile has a concentration up to about $9.5 \times 10^{18}$ cm$^\wedge$-3, to a depth of about 30 nanometers from the surface, and extending under the dielectric charge trapping structure by about 10 nanometers.

Figure 6:
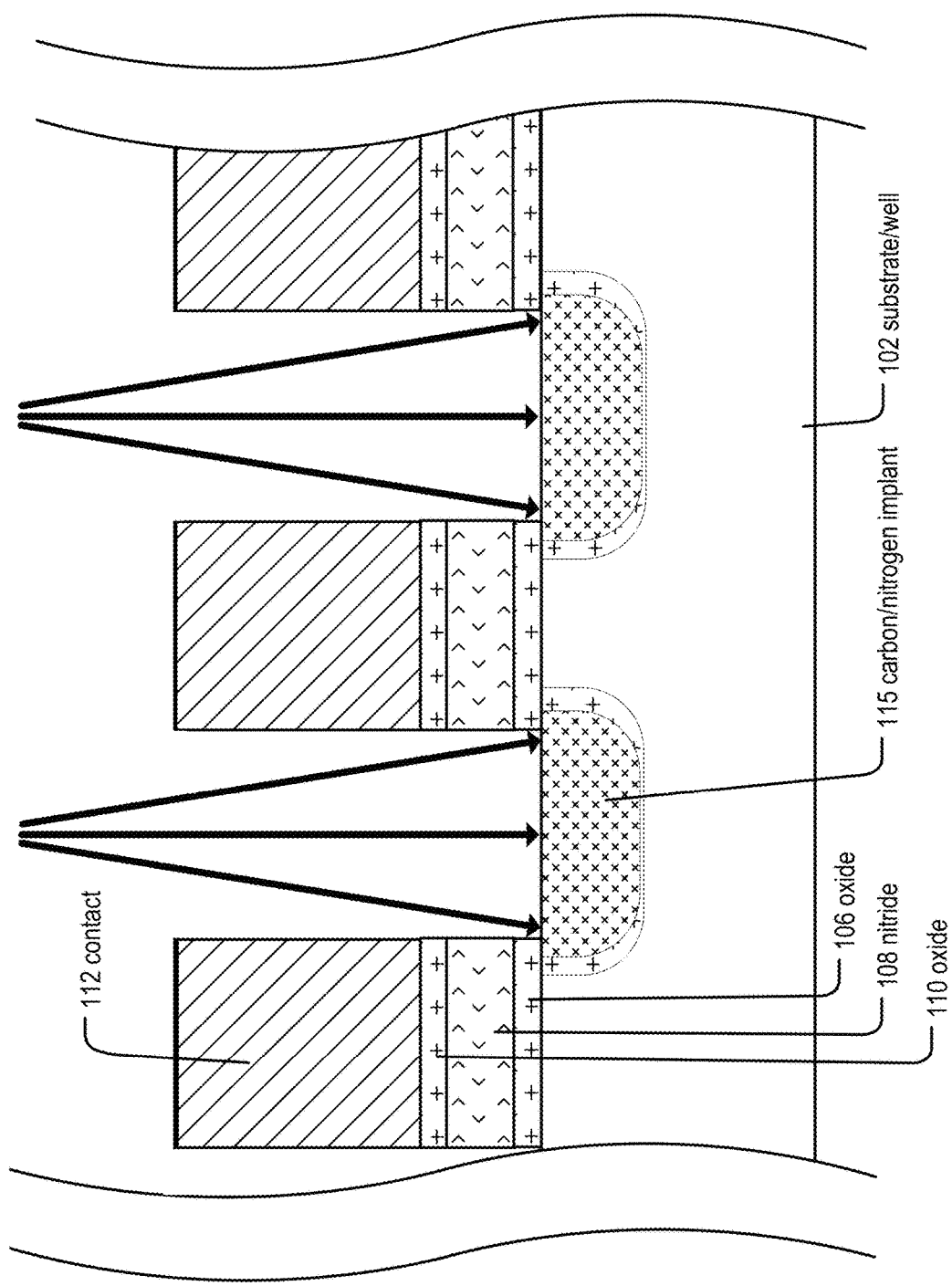
FIG. 6 is a cross-section of a memory array taken along the word line, showing implantation of a diffusion barrier dopant such as carbon.

FIG. 6 illustrates a following stage in the manufacturing process showing results of implantation of diffusion suppression dopant 115, such as carbon or nitrogen, in the region of the bit lines in the substrate or well 102. An example implantation energy can be in the range of 5 keV to 25 keV, an example implantation dose is in the range of $5 \times 10^{14}$ cm$^\wedge$-2 to $3 \times 10^{15}$ cm$^\wedge$-2, and an example implantation tilt angle range is from 0 to 15 degrees. In some embodiments, more than one diffusion suppression impurity can be used, including a combination of carbon and nitrogen for example, or combinations including fluorine.

Figure 7:
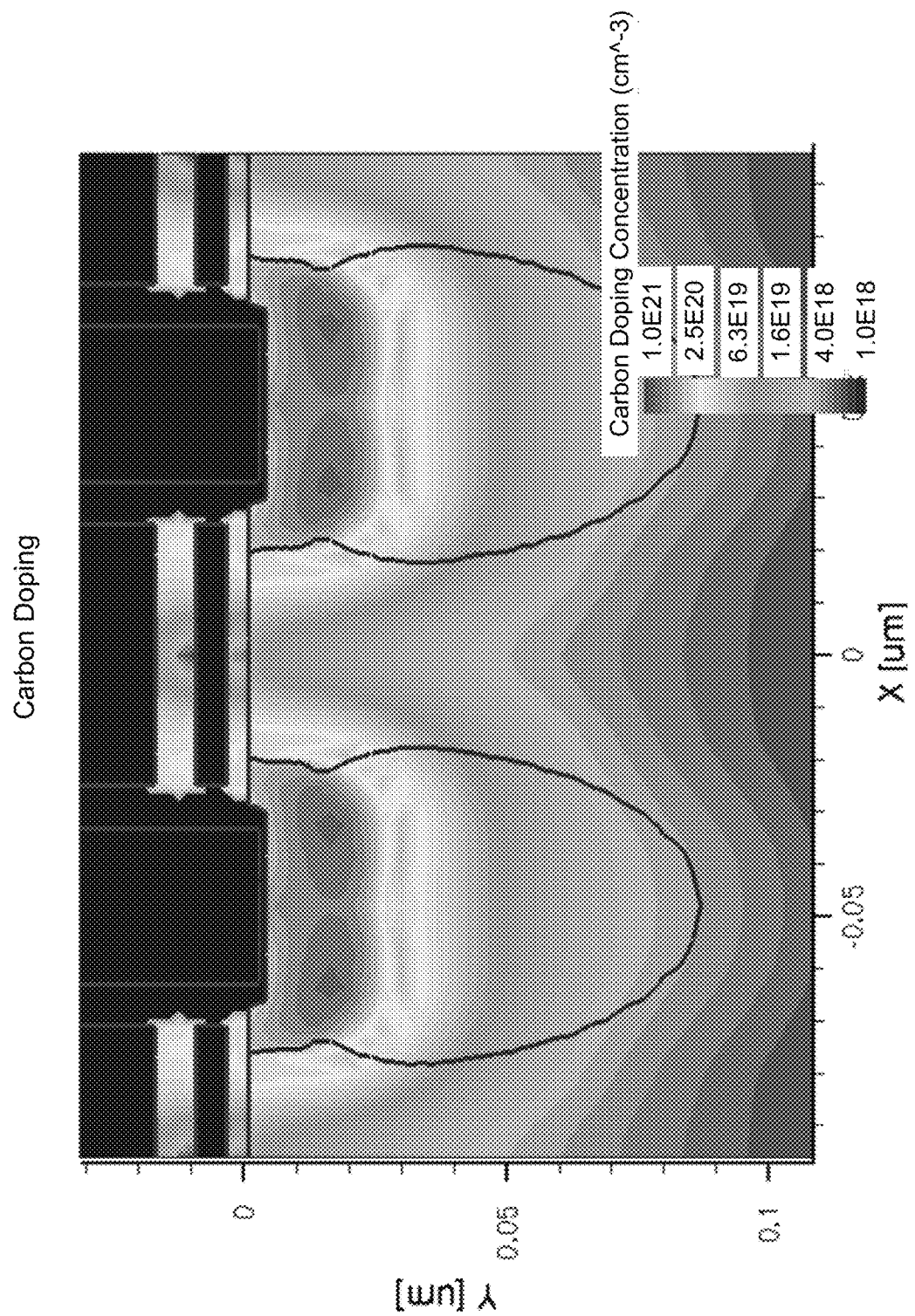
FIG. 7 is a graph showing a simulation of a distribution of carbon concentration of a cross-section of a memory array.

FIG. 7 is a graph showing a simulation of a carbon doping concentration of a cross-section of a memory array along the word line orientation, including the buried bit lines to the right and left and the channel in between the bit lines. The impurity volume occupied by the carbon dopant has a size based on a contour line for a concentration of about $10^\wedge 20$ cm$^\wedge$-3, of about 50 nm laterally, so that it includes impurities in a region between the channel region and the source/drain terminal. The impurity has a contour line for a concentration of about $10^\wedge 20$ cm$^\wedge$-3 including a region in the interface between the source/drain line to be formed and the channel region, that substantially underlies the data storage structure, with a contour line of about $10^\wedge 21$ cm$^\wedge$-3 at a depth of about 25 nanometers in this example.

Figure 8:
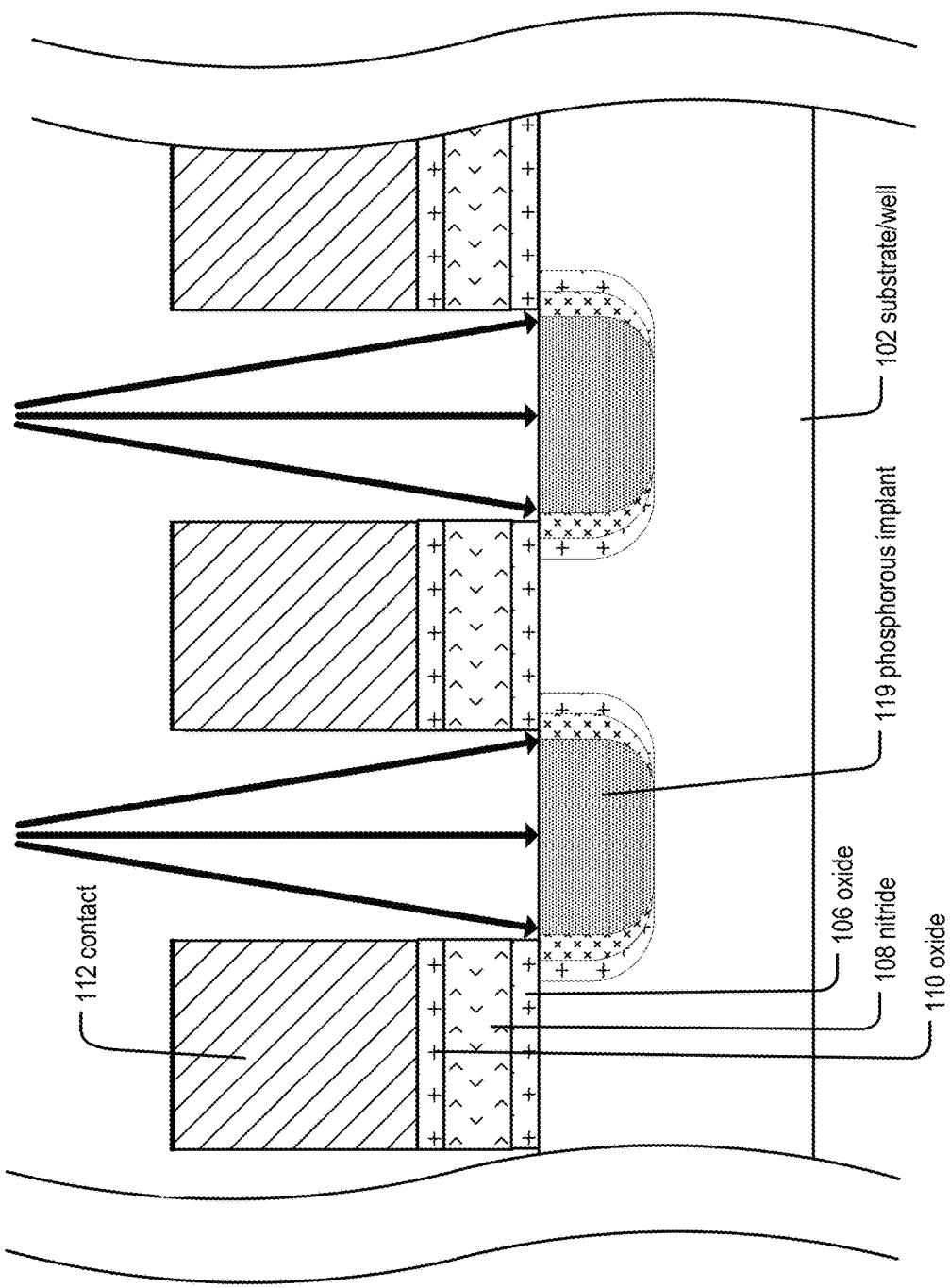
FIG. 8 is a cross-section of a memory array taken along the word line, showing implantation of n-type phosphorous.

FIG. 8 illustrates a following stage in the manufacturing process, with a cross-section of a memory array taken along the word line, showing phosphorous impurity in region 119. An example implantation energy can be in the range of 5 keV to 25 keV, an example implantation dose is in the range of $5 \times 10^{14}$ cm$^\wedge$-2 to $3 \times 10^{15}$ cm$^\wedge$-2, and an example implantation tilt angle range is from 0 to 15 degrees. The impurity region for the phosphorous impurity can be narrower, along the width of the source/drain line, than the impurity region for the diffusion suppression impurity.

Figure 9:
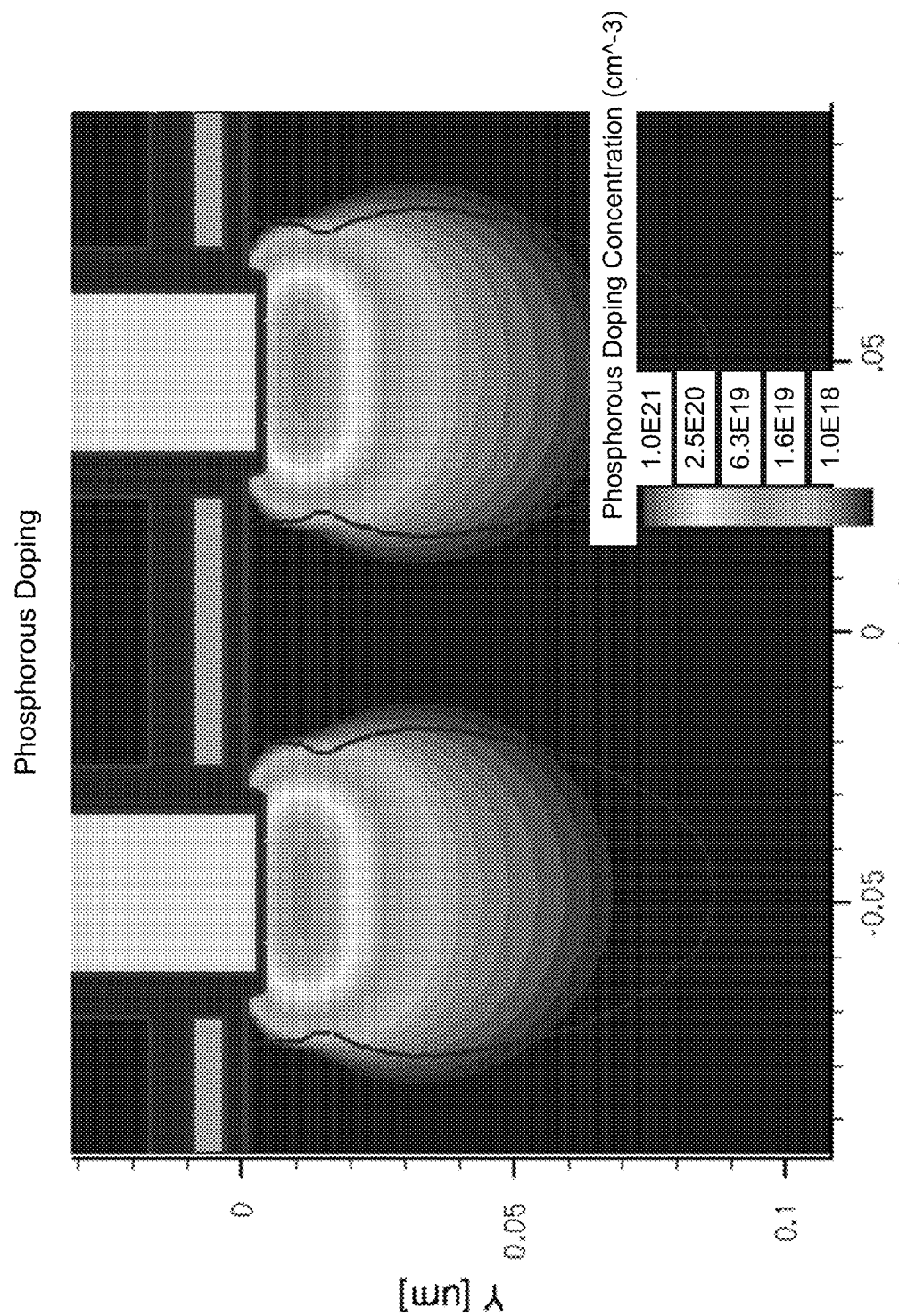
FIG. 9 is a graph showing a simulation of a distribution of n-type phosphorous concentration of a cross-section of a memory array.

FIG. 9 is a graph showing a simulation of phosphorous doping concentration of a cross-section of a memory array along the word line orientation, including the buried bit lines to the right and left and the channel in between the bit lines. The volume occupied by the phosphorous dopant has a size based on a contour line for a concentration of about $10^\wedge 20$ cm$^\wedge$-3, of about 40 nm laterally, and a depth of about 30 nm. Thus, the phosphorous doping does not significantly encroach on the channel region of the charge storage structure. Also, as schematically shown in FIG. 1, the carbon region 602 extends into the interface region past the sides of the phosphorous region 119, so that it tends to confine the phosphorous diffusion in the lateral dimension.

Figure 10:
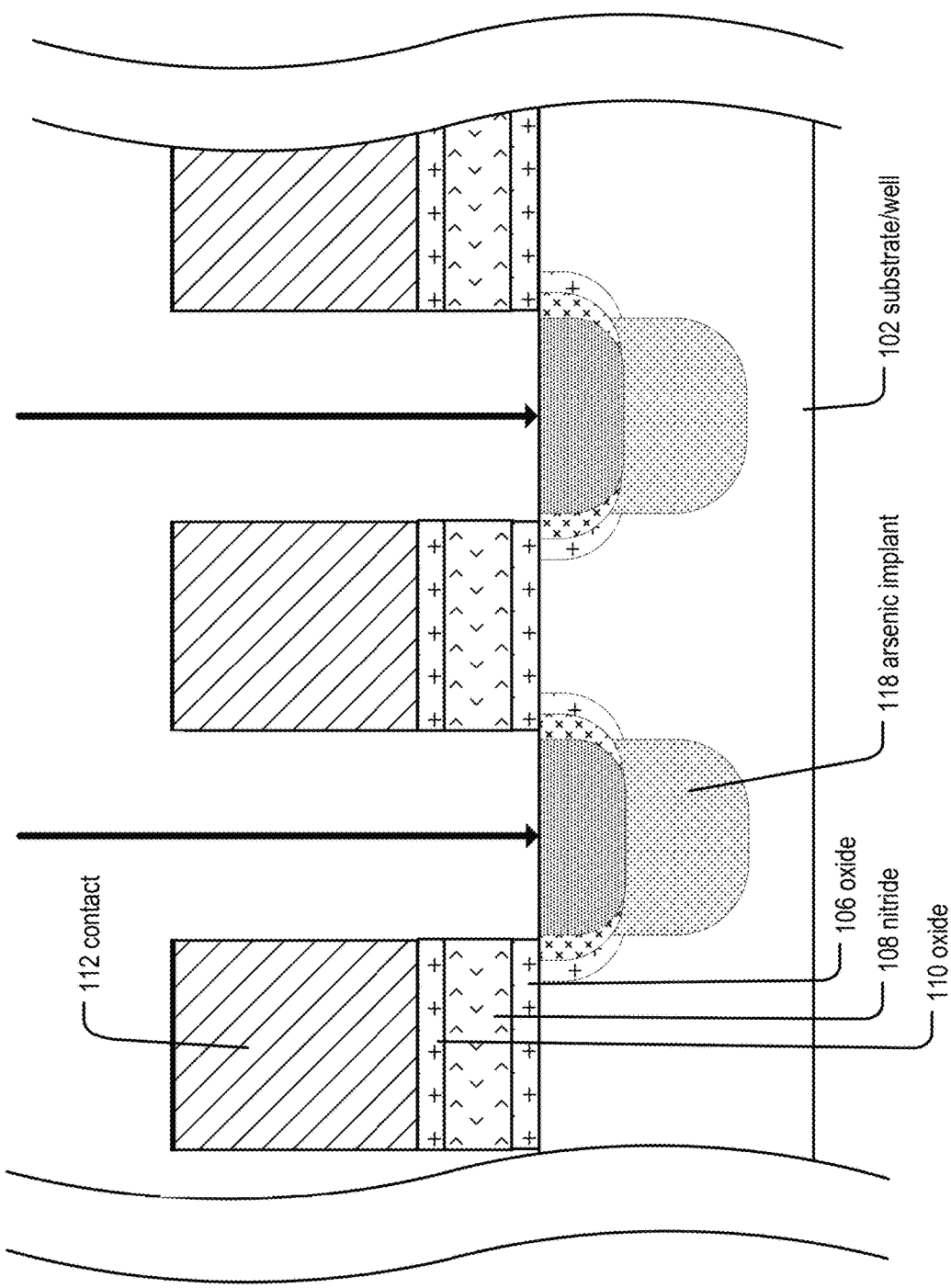
FIG. 10 is a cross-section of a memory array taken along the word line, showing deep implantation of n-type arsenic.

FIG. 10 illustrates a following stage in the manufacturing process, with a cross-section of a memory array taken along the word line, showing deep implantation of arsenic in region 118. An example implantation energy is in the range of 10 keV to 70 keV, an example implantation dose is in the range of $3 \times 10^{13}$ cm$^\wedge$-2 to $1 \times 10^{15}$ cm$^\wedge$-2, and an example implantation tilt angle range is 0 degrees.

Figure 11:
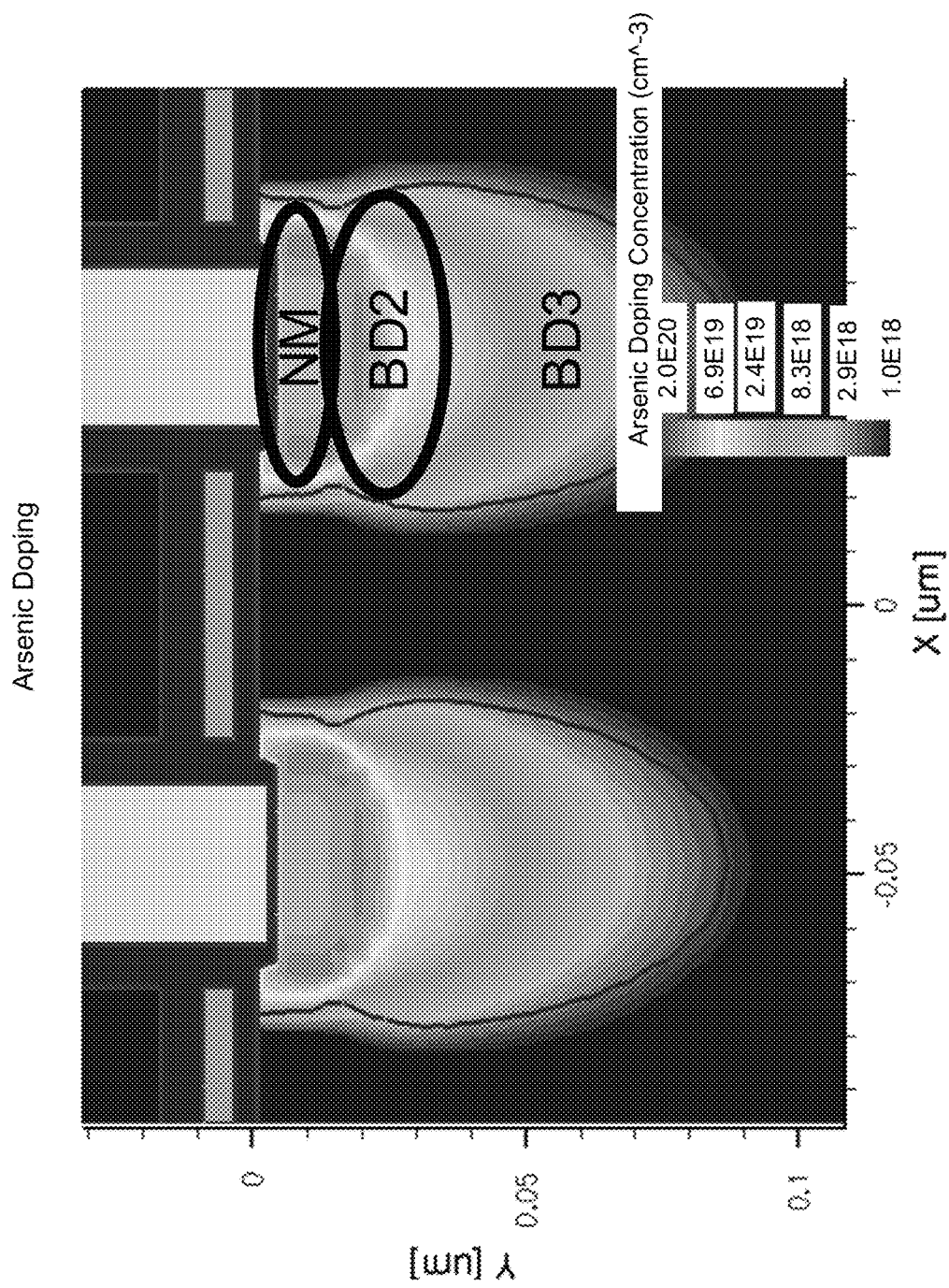
FIG. 11 is a graph a simulation of a distribution of n-type arsenic concentration of a cross-section of a memory array.

FIG. 11 is a graph showing a simulation of arsenic doping concentration of a cross-section of a memory array along the word line orientation, including the buried bit lines to the right and left and the channel in between the buried bit lines. The regions labeled NM, BD2 and BD3 in the drawings correspond with three stages of arsenic implantation at different energies and depths. In this labeling convention, the phosphorous implant would be labelled "BD1." The volume occupied by the arsenic dopant has a size based on a contour line for a concentration of about $10^\wedge 19$ cm$^\wedge$-3, having a depth of about 70 nm and a width of about 50 nm.

The sequence of implanting impurities described herein, including forming a halo implant, then a diffusion suppression impurity, followed by a phosphorous impurity and then an arsenic impurity, can be changed a suits a particular implementation. It is desirable however that the diffusion suppression impurity precede the phosphorous impurity.

Figure 12:
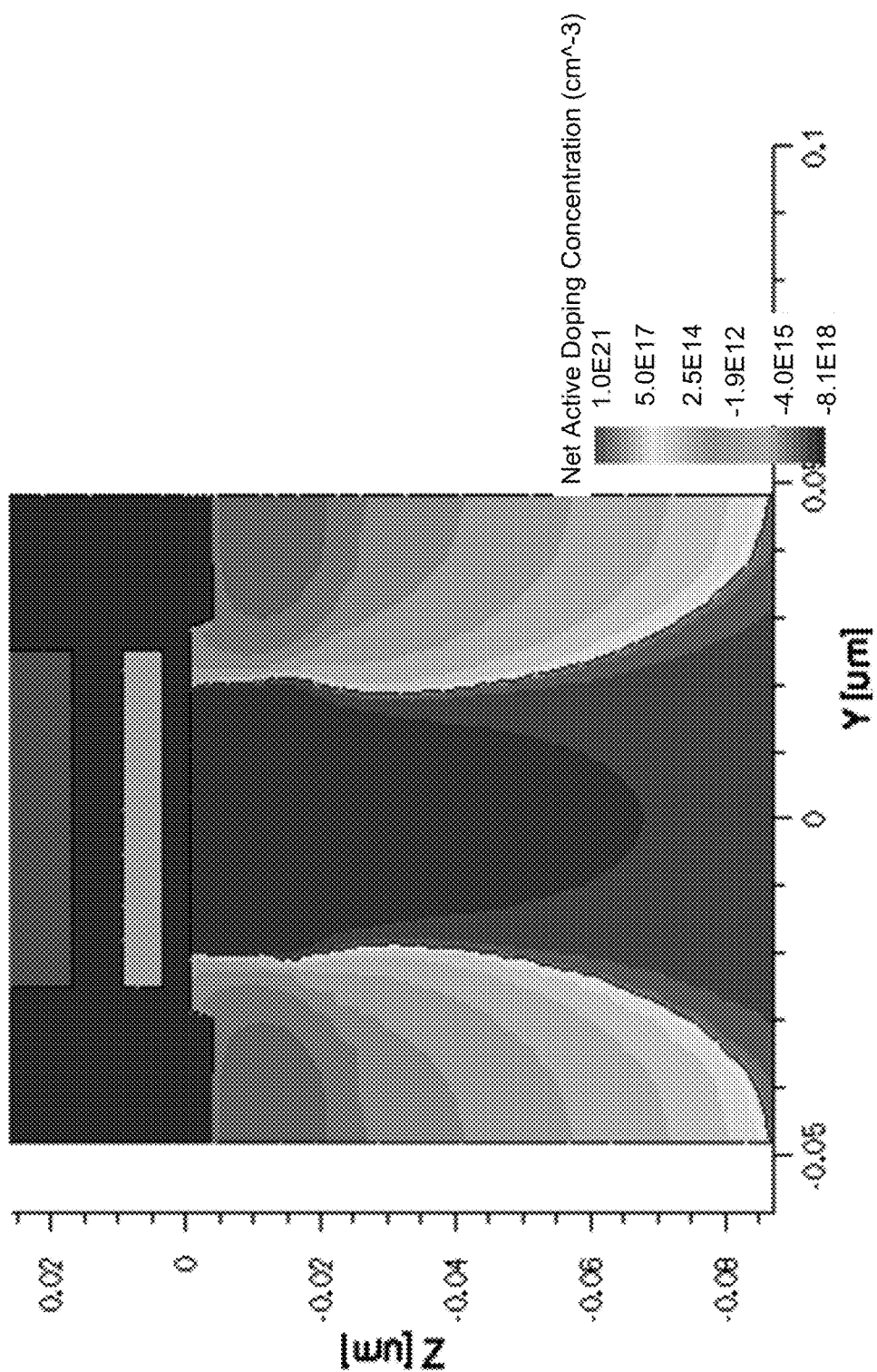
FIG. 12 is a graph showing a simulation of a net active doping concentration of a cross-section of a memory array.

FIG. 12 is a graph showing simulation of a net active doping concentration of a cross-section of a memory cell along the word line orientation, including the buried source/drain terminals to the right and left and the channel region in between the bit lines having the composite impurity profile resulting from the process of FIGS. 3-11.

The graph shows a net doping concentration, with positive concentration values indicating net n-type doping and negative concentration values indicating net p-type doping. The graph shows an abrupt and steep doping profile between the n-type source/drain terminals and the p-type channel. The n-type source/drain terminals have a peak net n-type concentration of about $10^\wedge 21$ cm$^\wedge$-3. The net dopant concentration changes steeply from the n-type peak in the n-type bit line to the p-type channel, over a lateral distance of about 10 nm. The channel has a net p-type concentration of about $10^\wedge 18$ cm$^\wedge$-3.

Unlike logic transistors, the memory bit lines are structured to encourage hot carrier effects with this steep doping profile. Accordingly, the memory bit lines omit structures such as lightly doped drains and source/drain extensions that would make the doping profile shallower between the bit line and the channel. Shallower doping profiles discourage hot carrier effects that are useful in memory operations with memory cells.

Figure 13:
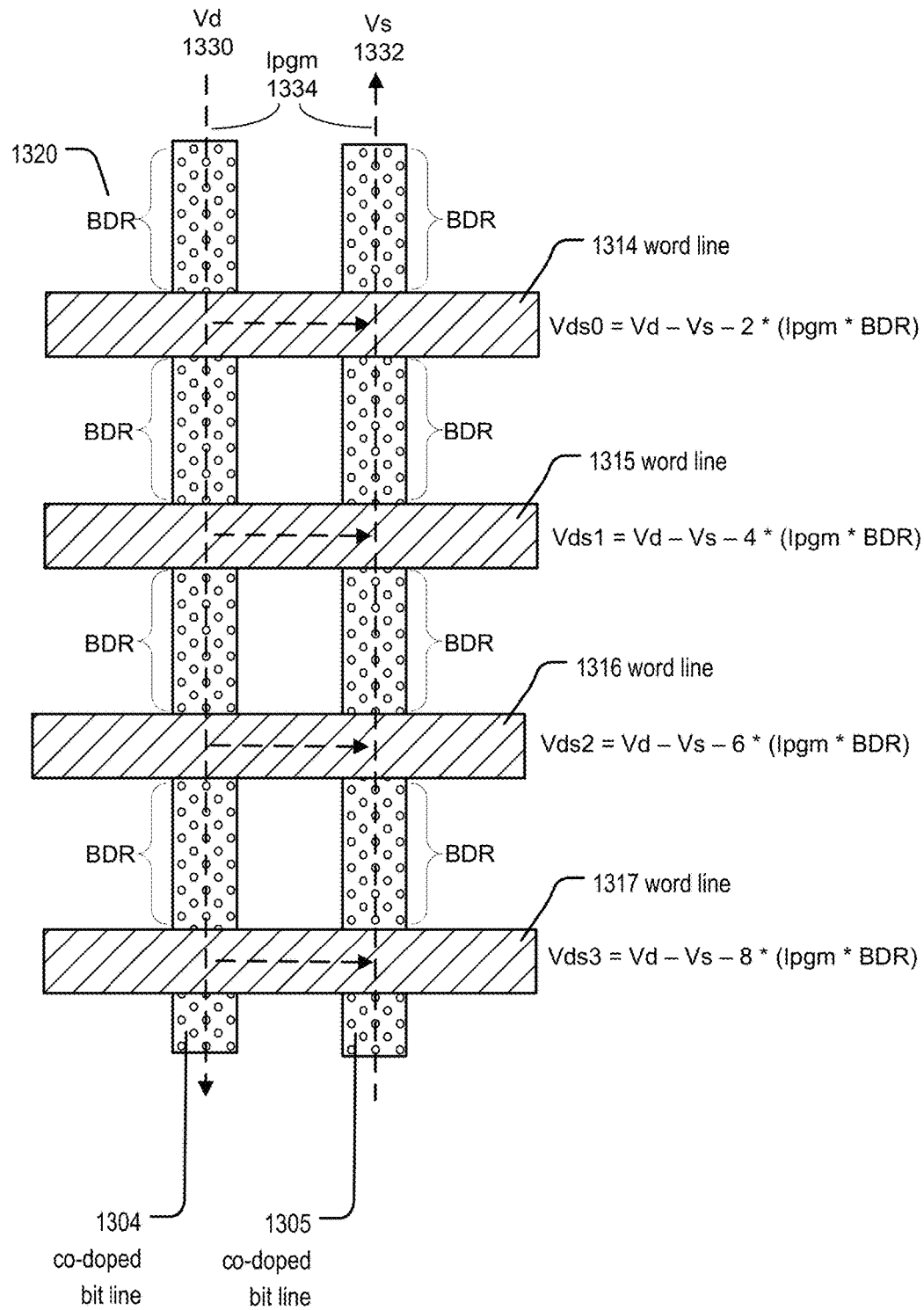
FIG. 13 is a top view of a memory array, with a drain-to-source voltage that decreases as the number of buried diffusion bit line segments increases between (i) the selected word line and (ii) Vd and Vs.

FIG. 13 is a top view of a memory array, with a drain-to-source voltage magnitude that decreases as the number of buried diffusion bit line segments increases between (i) the selected word line and (ii) drain voltage Vd and source voltage Vs. The figure is referred to for the purpose of describing a problem solved by the buried diffusion source/drain line structure described herein for a dense, virtual ground array.

Composite impurity source/drain lines 1304 and 1305 are shown with a vertical orientation. Word lines 1314, 1315, 1316, and 1317 are shown with a horizontal orientation. Composite impurity source/drain lines 1304 and 1305 are biased with drain voltage Vd 1330 and source voltage 1332 Vs respectively. The direction of program current Ipgm 1334 is shown as flowing from drain voltage Vd 1330 and to source voltage 1332 Vs.

Equivalent lengths of the source/drain lines having a unit of buried diffusion resistance BDR 1320 are shown. When word line 1314 is selected to apply a program gate voltage to part of the memory array along word line 1314, only a distance having one BDR separates the word line 1314 from the drain voltage Vd 1330 and one BDR separates the word line 1314 from the source voltage 1332 Vs. Similarly, a distance of having two BDRs separates the part of the memory array along word line 1315 from the drain voltage Vd 1330 and source voltage 1332 Vs; a distance having three BDRs separates the part of the memory array along word line 1316 from the drain voltage Vd 1330 and source voltage 1332 Vs; and a distance having four BDRs separates the part of the memory array along word line 1317 from the drain voltage Vd 1330 and source voltage 1332 Vs.

The arrows show current flow from drain voltage Vd 1330, through a number of BDRs along composite impurity source/drain line 1304, through part of the substrate or well positioned between composite impurity source/drain lines 1304 and 1305 under the memory cell controlled by a particular word line, through a number of BDRs along composite impurity source/drain line 1305, and to source voltage 1332 Vs.

The program current Ipgm 1334 flows through an increasing number of BDRs, as the distance increases between (i) drain voltage Vd 1330 and source voltage 1332 Vs and (ii) the selected word line 1314, 1315, 1316, or 1317 coupled to the memory cell undergoing programming. Each additional BDR along the path of program current Ipgm 1334 results in another voltage drop. So the effective drain to source voltage Vds at the memory cell decreases, as the distance increases between (i) drain voltage Vd 1330 and source voltage 1332 Vs and (ii) the selected word line 1314, 1315, 1316, or 1317 coupled to the memory cell undergoing programming.

For the memory cells controlled by word line 1314, the program current Ipgm 1334 flows through a distance of 1 BDR in composite impurity source/drain line 1304 and again through a distance of 1 BDR in composite impurity source/drain line 1305. So the available drain to source voltage at the memory cell at word line index 0, $Vds0=Vd-Vs-2*(Ipgm*BDR)$.

For the memory cells controlled by word line 1315, the program current Ipgm 1334 flows through a distance of 2 BDRs in composite impurity source/drain line 1304 and again through a distance of 2 BDRs in source/drain line 1305. So the available drain to source voltage at the memory cell at word line index 1, $Vds1=Vd-Vs-4*(Ipgm*BDR)$.

For the memory cells controlled by word line 1316, the program current Ipgm 1334 flows through a distance of 3 BDRs in composite impurity source/drain line 1304 and again through a distance of 3 BDRs in composite impurity source/drain line 1305. So the available drain to source voltage at the memory cell at word line index 2, $Vds2=Vd-Vs-6*(Ipgm*BDR)$.

For the memory cells controlled by word line 1317, the program current Ipgm 1334 flows through a distance of 4 BDRs in composite impurity source/drain line 1304 and again through a distance of 4 BDRs in source/drain line 1305. So the available drain to source voltage at the memory cell at word line index 3, $Vds3=Vd-Vs-8*(Ipgm*BDR)$.

Using the technology described herein, the BDR can be substantially reduced, while maintaining small dimensions and deep junctions as shown in FIG. 1.

Figure 14:
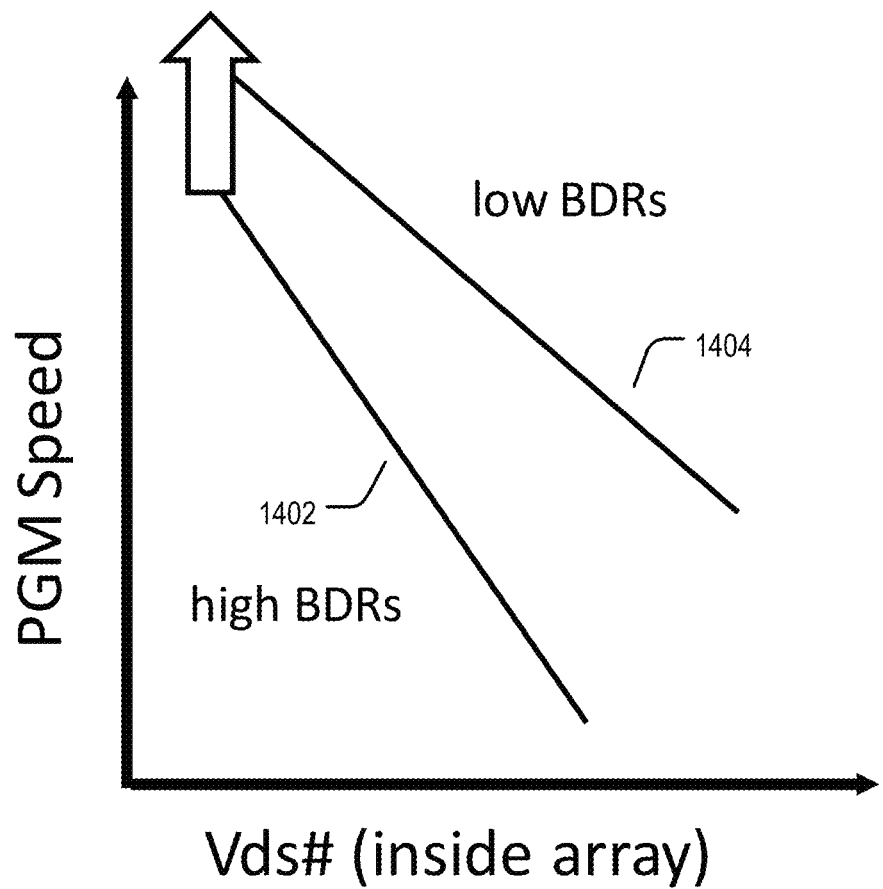
FIG. 14 is a simplified graph showing that lower buried diffusion bit line resistance is associated with improved memory performance.

FIG. 14 is a simplified graph showing that lower buried diffusion source/drain line resistance is associated with improved memory performance.

A graph of programming speed versus Vds# is shown, where the # refers to the word line index 1, 2, 3, 4, . . . , as described above. Along the programming speed axis, lower values closer to the origin correspond to slower programming speed, and higher values further from the origin correspond to faster programming speed. Vds# indicates a particular drain-to-source voltage applied to memory cells along a particular word line. As explained in FIG. 13, as distance increases between drain and source voltages and the word line, a larger buried drain resistance separates the drain and source voltages from the part of the memory array along a particular word line. So increasing drain Vds# corresponds to a lower effective drain-to-source voltage that is effectively applied to a particular while memory cell while programming the particular memory cell. As shown by the graph, a lower effective drain-to-source voltage during programming results in slower programming speed in programming method applying hot carrier injection, such as hot electron injection. In addition to the higher available source-drain voltage, the programming speed is improved by the abrupt junction.

Two traces are shown. Trace 1402 has a relatively high buried diffusion resistance. Trace 1402 represents a memory array with bit lines that do not have composite impurity profiles described herein, and has relatively slow programming speed.

Trace 1404 has a relatively low buried diffusion resistance. Trace 1404 represents a memory array with bit lines that have composite impurity profiles, and has relatively fast programming speed. The arrow indicates that lower buried diffusion resistance is associated with enhanced hot carrier effects that assist memory operations.

Figure 15:
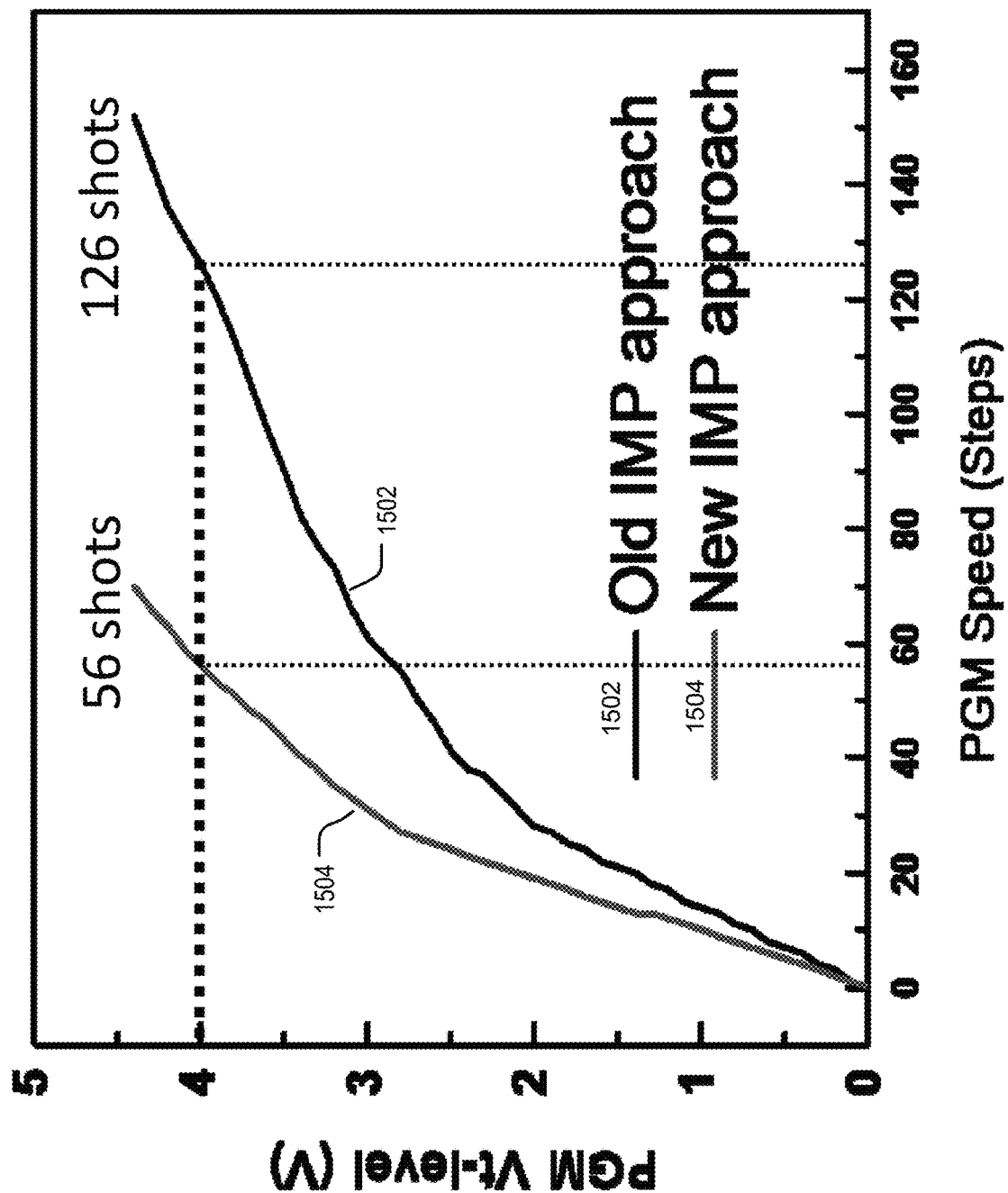
FIG. 15 is a graph showing a faster programming speed associated with the composite impurity bit lines.

FIG. 15 is a graph of experimental results, showing a faster programming speed associated with the composite impurity source/drain lines.

The graph shows programmed threshold voltage versus programming speed. Two traces are shown. Trace 1502 corresponds to the old implantation approach with source/drain lines that do not carbon and phosphorous impurity profiles described herein. Trace 1502 shows that 126 programming shots are required to program the threshold voltage from 0 V to 4 V.

Trace 1504 corresponds to the new implantation approach with source/drain lines that have composite impurity profiles. Trace 1504 shows that only 56 programming shots are required to program the threshold voltage from 0 V to 4 V. So source/drain lines that have composite impurity profiles result in fewer than half of the number of programming shots that were required without composite impurity source/drain lines. The requirement for fewer programming shots results in a dramatic increase in programming speed of about 56% (100%−(56/126)).

Figure 16:
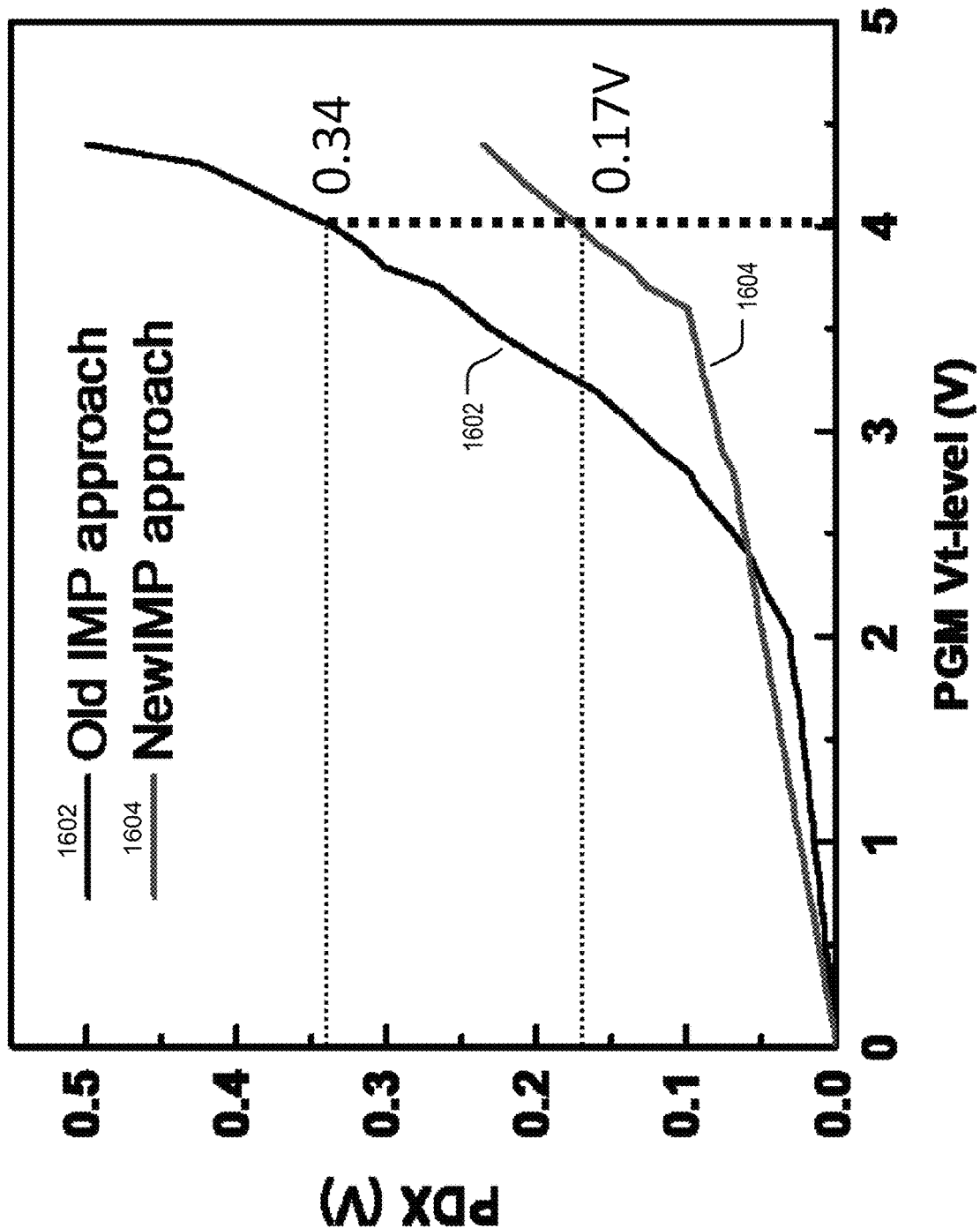
FIG. 16 is a graph showing reduced program disturb associated with the composite impurity bit lines.

FIG. 16 is a graph showing reduced program disturb associated with the composite impurity source/drain lines.

The graph shows program disturb versus programmed threshold voltage level. Two traces are shown. Trace 1602 corresponds to the old implantation approach with source/drain lines that do not have composite impurity profiles described herein. Trace 1602 shows that, when a memory cell is programmed so that the threshold voltage is raised from 0 V to 4 V, a neighboring memory cell suffers program disturb of 0.34 V.

Trace 1604 corresponds to the new implantation approach with source/drain lines that have composite impurity profiles. Trace 1604 shows that, when a memory cell is programmed so that the threshold voltage is raised from 0 V to 4 V, a neighboring memory cell suffers program disturb of only 0.17 V. So source/drain lines that have composite impurity profiles result in a dramatically improved, half of the program disturb that occurred without co-coped bit lines.

Figure 17:
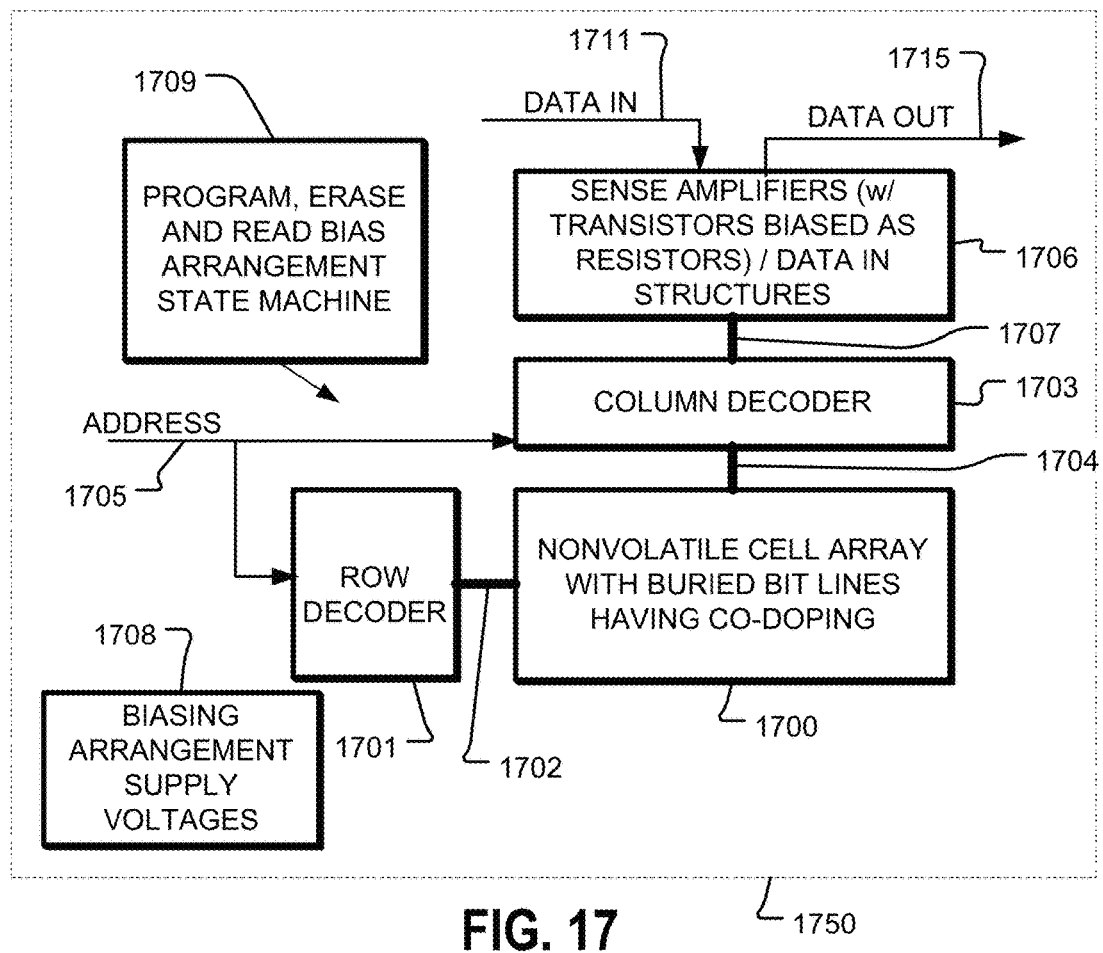
FIG. 17 is a block diagram showing an integrated circuit including a memory array with composite impurity buried bit lines.

FIG. 17 is a block diagram showing an integrated circuit including a memory array with buried source/drain lines implanted with a diffusion suppression dopant such as carbon or nitrogen.

The integrated circuit 1750 includes a memory array 1700 of nonvolatile memory cells, on a semiconductor substrate. The array 1700 includes source/drain lines that have composite impurity profiles, such as illustrated in FIG. 1. A row decoder 1701 is coupled to a plurality of word lines 1702 arranged along rows in the memory array 1700. A column decoder 1703 is coupled to a plurality of bit lines 1704 arranged along columns in the memory array 1700. Addresses are supplied on bus 1705 to column decoder 1703 and row decoder 1701. Sense amplifier and data-in structures 1706 are coupled to the column decoder 1703 via data bus 1707. Data is supplied via the data-in line 1711 from input/output ports on the integrated circuit 1750, or from other data sources internal or external to the integrated circuit 1750, to the data-in structures in block 1706. Data is supplied via the data-out line 1715 from the sense amplifiers in block 1706 to input/output ports on the integrated circuit 1750, or to other data destinations internal or external to the integrated circuit 1750. A bias arrangement state machine 1709 controls the application of bias arrangement supply voltages 1708. In embodiments using hot electron programming or other hot carrier programming techniques, the state machine 1709 and bias arrangement supply voltages 1708 are part of a circuit for applying the bias voltages for programming and erasing operations that induce hot carriers.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a memory array including a plurality of source/drain lines separated by channel regions in a semiconductor substrate, wherein the source/drain lines have a first impurity which provides charge carriers having a carrier type, making the source/drain lines conductive;
a plurality of word lines overlying the channel regions;
data storage structures in the cross points between the word lines and the channel regions;
a second impurity which suppresses diffusion of the first impurity in interface regions between the channel regions and the source/drain lines; and
means including a third impurity having a higher atomic mass than the first impurity and providing charge carriers of the same carrier type as the first impurity for blocking secondary charge carriers generated in one memory cell from affecting the channel regions of adjacent memory cells.

2. The integrated circuit of claim 1, wherein the memory array is a virtual ground array, and the plurality of source/drain lines are buried diffusion bit lines.

3. The integrated circuit of claim 1, wherein the first impurity is phosphorous and the second impurity is carbon.

4. The integrated circuit of claim 1, wherein the first impurity is phosphorous and the second impurity is nitrogen.

5. The integrated circuit of claim 1, wherein the first impurity is phosphorous and the second impurity is fluorine.

6. The integrated circuit of claim 1, wherein the first impurity has a distribution profile with a maximum depth on a contour line at $10^{20}$ atoms/cm$^3$ between the channel region, and the third impurity in said means has a distribution profile such that there is a greater concentration of the third impurity than the first impurity in a region below the maximum depth of the contour line of the first impurity between the channel regions.

7. The integrated circuit of claim 1, wherein the first impurity is phosphorous, the second impurity is one of fluorine, carbon and nitrogen, and the third impurity is arsenic.

8. The integrated circuit of claim 1, including a fourth impurity in interface regions between the channel regions and the source/drain lines, and providing carriers having a carrier type opposite of the carriers provide by the first impurity.

9. The integrated circuit of claim 1, wherein the channel regions have a nominal length between source/drain lines of less than 50 nm.

10. The integrated circuit of claim 1, further comprising control circuitry that biases the plurality of source/drain lines and the plurality of word lines for operations on the plurality of memory cells, that include inducing hot carriers in the interface regions.

11. The integrated circuit of claim 1, wherein the first impurity has a distribution profile having a first width and a first depth, and the second impurity has a distribution profile having a second width greater than the first width and a second depth greater than the first depth, whereby a diffusion of the first impurity is suppressed both in the width dimension and in the depth dimension.

12. The integrated circuit of claim 1, wherein:
the second impurity is at least one of fluorine, carbon and nitrogen in interface regions between the channel regions and the source/drain lines.

13. An integrated circuit, comprising:
a memory cell including a source/drain terminal adjacent a channel region in a semiconductor substrate, and a gate and data storage structure overlying the channel region;
a phosphorous impurity and an arsenic impurity deeper than the phosphorous impurity in the source/drain terminal;
a halo impurity in an interface region between the channel and the source/drain terminal; and
a diffusion suppression impurity which at least partially surrounds the phosphorous impurity.

14. The integrated circuit of claim 13, wherein the diffusion suppression impurity is one of fluorine, carbon, and nitrogen.

15. A method for manufacturing a memory, comprising:
forming a memory array including forming a plurality of source/drain lines separated by channel regions in a semiconductor substrate, including implanting a first impurity in the source/drain lines which provides charge carriers having a carrier type, making the source/drain lines conductive;

forming a plurality of word lines overlying the channel regions;

forming data storage structures in the cross points between the word lines and the channel regions;

suppressing diffusion of the first impurity into the channel regions by implanting a second impurity in interface regions between the channel regions and the source/drain lines; and forming a means for blocking secondary charge carriers generated in one memory cell from affecting the channel regions of adjacent memory cells by implanting a third impurity in the source/drain lines, the third impurity having a higher atomic mass than the first impurity and providing charge carriers of the same carrier type as the first impurity.

16. The method of claim 15, including forming a halo implant in interface regions between the source/drain lines and the channel regions.

17. The method of claim 15, wherein the first impurity has a distribution profile having a first width and a first depth, and the second impurity has a distribution profile having a second width greater than the first width and a second depth greater than the first depth, whereby a diffusion of the first impurity is suppressed both in the width dimension and in the depth dimension.

18. The method of claim 15, wherein the second impurity is one of fluorine, carbon, and nitrogen.

19. The method of claim 15, wherein the first impurity is phosphorous, the second impurity is one of fluorine, carbon and nitrogen, and implanting the third impurity relatively deeply compared to the first impurity, wherein the third impurity is arsenic.

* * * * *